(12) United States Patent
Reynaert et al.

(10) Patent No.: US 9,281,796 B2
(45) Date of Patent: *Mar. 8, 2016

(54) POLYPHASE FILTER FOR MM-WAVE FREQUENCIES FEATURING SYMMETRIC LAYOUT

(71) Applicant: ST-Ericsson SA, Plan-les-Ouates (CH)

(72) Inventors: Patrick Reynaert, Vertrijk (BE); Shailesh Kulkarni, Leuven (BE); Dixian Zhao, Leuven (BE)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,362

(22) Filed: Jun. 3, 2015

(65) Prior Publication Data

US 2015/0280680 A1   Oct. 1, 2015

Related U.S. Application Data

(62) Division of application No. 13/722,509, filed on Dec. 20, 2012, now Pat. No. 9,077,307.

(51) Int. Cl.
*H03H 7/06* (2006.01)
*H03H 7/21* (2006.01)
*H03H 7/01* (2006.01)

(52) U.S. Cl.
CPC .............. *H03H 7/06* (2013.01); *H03H 7/0138* (2013.01); *H03H 7/21* (2013.01); *H03H 2007/0192* (2013.01)

(58) Field of Classification Search
CPC ........... H03H 7/06; H03H 7/21; H03H 11/22; H03H 2007/0192; H03H 2011/0494; H03H 7/0138
USPC .................................................. 333/172, 168
See application file for complete search history.

(56) References Cited

U.S. PATENT DOCUMENTS

| 8,266,553 | B1 | 9/2012 | Nguyen et al. |
| 9,077,307 | B2 * | 7/2015 | Reynaert et al. |
| 2006/0244551 | A1 | 11/2006 | Ozasa et al. |
| 2012/0146741 | A1 | 6/2012 | Yen et al. |

OTHER PUBLICATIONS

Kulkarni et al "Design of an optimal layout Polyphase Filter for mm-Wave Quadrature Lo Generation." IEEE Transactions on Circuits and Systems—II: Express Briefs, vol. 60, No. 4, Mar. 27, 2013, pp. 202-206.

(Continued)

*Primary Examiner* — Benny Lee
*Assistant Examiner* — Rakesh Patel
(74) *Attorney, Agent, or Firm* — Coats & Bennett, PLLC

(57) ABSTRACT

A two-stage, passive, RC polyphase filter for mm-wave quadrature LO generation is presented. The filter features an innovative, symmetrical layout structure, which is more robust to parasitics than the conventional layout. Layout parasitics which become more important at mm-wave frequencies are identified and a compensated. Impedance variations and transfer functions are evaluated considering these dominant parasitics. More than 15 dB improvement in image rejection ratio is achieved in comparison with conventional layouts. Using the inventive techniques more than 35 dB of image rejection ratio over a bandwidth of 6 GHz is demonstrated in an outphasing transmitter at 60 GHz in 40 nm CMOS.

16 Claims, 12 Drawing Sheets

(56) References Cited

OTHER PUBLICATIONS

Crols et al. "A Single-Chip 900 MHz CMOS Receiver Front-End with a High Performance Low-IF Topology." IEEE Journal of Solid-State Circuits, Dec. 1995, pp. 1483-1492, vol. 30, No. 12.

Crols et al. "Low-IF Topologies for High-Performance Analog Front Ends of Fully Integrated Receivers." IEEE Transactions on Circuits and Systems-II: Analog and Digital Signal Processing, Mar. 1998, pp. 269-282, vol. 45, No. 3.

Behbahani et al. "CMOS Mixers and Polyphase Filters for Large Image Rejeciton." IEEE Journal of Solid-State Circuits, Jun. 2001, pp. 873-887, vol. 36, No. 6.

Kaukovuori et al. "Analysis and Design of Passive Polyphase Filters." IEEE Transactions on Circuits and Systems-I: Regular Papers, Nov. 2008, pp. 3023-3037, vol. 55, No. 10.

Notten et al. "60GHz Quadrature Signal Generation with a Single Phase VCO and Polyphase Filter in a 0.25μm SiGe BiCMOS technology." IEEE BCTM 11.1, Oct. 13-15, 2008, pp. 178-181.

Parsa et al. "A New Transceiver Architecture for the 60-GHz Band." IEEE Journal of Solid-State Circuits, Mar. 2009, pp. 751-762, vol. 44, No. 3.

Behzad Razavi. "A Millimiter-Wave CMOS Heterodyne Receiver With On-Chip LO and Divider." IEEE Journal of Solid-State Circuits, Feb. 2008, pp. 477-485, vol. 43, No. 2.

* cited by examiner

TABLE 1
PERFORMANCE COMPARISON WITH PUBLISHED MMWAVE PPFs

| Ref, Technology | $f_0$ (GHz) | $IRR_{min}$ (dB) | BW covered below $IRR_C$ | |
|---|---|---|---|---|
| | | | BW(GHz) | $IRR_C$ (dB) |
| [1] RX,CMOS | 60 | 32.0 | 3.9 | 23.0 |
| [1] TX,CMOS | 60 | 23.0 | 5 | 18.3 |
| [2] CMOS | 20 | 28.0 | - | - |
| [3] BiCMOS | 60 | 28.6 | 2 | 28.6 |
| [4] SiGe:C | 60 | 32.5 | 7 | 24.0 |
| The present invention, CMOS | 60 | 58.0 | >7 | 35.0 |

FIG. 12

POLYPHASE FILTER FOR MM-WAVE FREQUENCIES FEATURING SYMMETRIC LAYOUT

CROSS-REFERENCE TO RELATED APPLICATIONS

This application is a divisional application of U.S. patent application Ser. No. 13/722,509, filed Dec. 20, 2012, now U.S. Pat. No. 9,077,307, entitled "POLYPHASE FILTER FOR MM-WAVE FREQUENCIES FEATURING SYMMETRIC LAYOUT," which is hereby incorporated by reference as if fully set forth herein.

FIELD OF INVENTION

The present invention relates generally to high frequency filter deign, and in particular to a symmetrical layout structure for a two stage passive RC polyphase filter for mm-wave quadrature local oscillator signal generation.

BACKGROUND

Radios operating in the extremely high frequency (EHF) band of the electromagnetic (EM) spectrum exhibit numerous advantages, and are anticipated to play a significant role in communication technology—particularly wireless, mobile communication devices. For example, radios operating in EHF exhibit numerous advantages over radios operating in other frequency bands of the spectrum, including license-free spectrum, relatively narrow beam antennas, and inherent security due to oxygen absorption and the narrow beam width.

As used herein, the extremely high frequency (EHF) band of the EM spectrum includes frequencies from approximately 30 to 300 GHz. This is the highest frequency range of what is considered to be Radio Frequency (RF) EM radiation. Above this frequency band, EM radiation is considered to be in the low infrared light spectrum (also referred to as terahertz radiation). EM energy in the EHF band has a wavelength in the range of approximately 10 mm to 1 mm. Hence, EHF EM radiation is also generally referred to as millimeter wave RF (mm-wave). Accordingly, the terms EHF and mm-wave are used synonymously herein when referring to a frequency band.

In the U.S., the Federal Communication Commission (FCC) has allocated an unprecedented 7 GHz of un-channelized spectrum for license-free operation between 57-64 GHz. In contrast, less than 0.5 GHz of spectrum is allocated between 2-6 GHz for WiFi and other license-free applications. The portion of the EHF band near 60 GHz thus represents a significant opportunity to implement multi-gigabit RF communication links. Standardization efforts in this area include WiGig and WirelessHD.

EHF radios utilize very narrow RF beams, enabling multiple EHF radio base stations or other transceivers to be installed on the same tower, rooftop, or the like, even if they are all operating at the same transmit and receive frequencies. Co-located radios operating in the same transmit and receive frequency ranges can easily be isolated from one another based on small lateral or angular antenna separations, and/or the use of cross-polarized antennas. While the RF beams are relatively narrow, however, they are sufficiently wide, e.g., compared to optical signals, such that fixed antennas may be accurately aligned by a non-expert installer with the use of a simple visual alignment tool, and communications are unaffected by minor antenna movement such as tower or building sway due to wind.

Oxygen attenuates RF signals near 60 GHz (e.g., ~57-64 GHz) due to a resonance of the oxygen molecule, a property that is unique to the near-60 GHz portion of the EM spectrum. While this property limits the distances that radio links at this frequency can cover, it also makes these links highly immune to interference from other radios at the same or near frequencies. For example, oxygen absorption ensures that a near-60 GHz signal will not extend far beyond its intended target.

The combination of narrow beam width and oxygen attenuation provides an inherent degree of security to near-60 GHz link communications. Due to the narrow beam width, an interceptor receiver must be placed directly in the main beam (and tuned to its carrier frequency) to receive a useful signal. In this position, it is likely to degrade the signal at the intended receiver sufficiently to allow for its detection. Due to oxygen attenuation, there is a limited distance beyond an intended receiver, along the main beam, at which a useful signal may be obtained by an interceptor receiver.

Accordingly, the demand is increasing for EHF capability in mobile communication devices, particularly near 60 GHz, to allow them to engage in communication channels supplemental to their primary channels (e.g., GSM, CDMA, LTE, and similar systems).

Since bandwidth is an expensive resource, most mm-wave transceivers make use of quadrature radio architectures so that both sides of the spectra can be used for information. Three common techniques used to generate quadrature signals are, (a) divide by two circuit along with an oscillator at twice the desired local oscillator (LO) frequency, (b) quadrature oscillators, and (c) single phase oscillator followed by polyphase filter (PPF). For more information, see the paper by A. Valero-Lopez, S. T. Moon, and E. Sanchez-Sinencio, titled, "Self-calibrated quadrature generator for WLAN multistandard frequency synthesizer," published in the *IEEE Journal of Solid-State Circuits*, vol. 41, no. 5, pp. 1031-1041, May 2006, the disclosure of which is incorporated herein by reference in its entirety.

Option (a) has the drawback of requiring a signal at double the frequency of operation, and therefore low signal levels and high phase noise due to low quality passives at mm-wave frequencies. See the paper by W. Volkaerts, M. Steyaert, and P. Reynaert, titled, "118 GHz fundamental VCO with 7.8 tuning range in 65 nm CMOS," published in the 2011 *IEEE Radio Frequency Integrated Circuits Symposium (RFIC)*, pp. 1-4, June 2011, the disclosure of which is incorporated herein by reference in its entirety.

Option (b) generates the quadrature LO signal by two coupled oscillators which compromise the phase noise and tuning range. See the paper by K. Scheir, S. Bronckers, J. Borremans, P. Wambacq, and Y. Rolain, titled, "A 52 GHz phased-array receiver front-end in 90 nm digital CMOS," published in the *IEEE Journal of Solid-State Circuits*, vol. 43, no. 12, pp. 2651-2659, December 2008, the disclosure of which is incorporated herein by reference in its entirety.

In option (c) a polyphase filter is used which can generally achieve wideband performance with sufficient quadrature accuracy by cascading two or more stages, which also simplifies the on-chip oscillator design compared to the other two techniques. See the papers by A. Parsa and B. Razavi, titled, "A new transceiver architecture for the 60-GHz band," published in the *IEEE Journal of Solid-State Circuits*, vol. 44, no. 3, pp. 751-762, March 2009, and Notten, M. G. M. and Veenstra, H., titled, "60 GHz quadrature signal generation with a single phase VCO and polyphase filter in a 0.25 µm SiGe BiCMOS technology," published at the *IEEE Bipolar/ BiCMOS Circuits and Technology Meeting*, 2008, pp. 178-181, the disclosures of both of which are incorporated herein by reference in their entireties.

However, mm-wave frequency polyphase filter designs have not been analyzed extensively. Parasitic capacitance in mm-wave frequency polyphase filter designs utilizing conventional layout techniques lead to significant signal loss and hence operational inefficiencies.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or delineate the scope of the invention. The sole purpose of this summary is to present some concepts disclosed herein in a simplified form as a prelude to the more detailed description that is presented later.

According to one or more embodiments described and claimed herein, a two-stage, passive, RC polyphase filter for mm-wave quadrature LO generation is presented. The filter features an innovative, symmetrical layout structure, which is more robust to parasitics than the conventional layout. Layout parasitics which become important at mm-wave frequencies are identified and are compensated. Impedance variations and transfer functions are evaluated considering these dominant parasitics. More than 15 dB improvement in image rejection ratio is achieved in comparison with conventional layouts. Using the inventive techniques more than 35 dB of image rejection ratio over a bandwidth of 6 GHz is demonstrated in an outphasing transmitter at 60 GHz in 40 nm CMOS.

One embodiment relates to a passive, quadrature, RC polyphase filter (PPF) stage operative at Extremely High Frequencies (EHF). The PPF includes first, second, third, and fourth inputs, numbered contiguously and corresponding first, second, third, and fourth outputs, also numbered contiguously. A resistor is interposed between each respective input and output. A first capacitor is coupled between the first input and second output; a second capacitor is coupled between the second input and fourth output; a third capacitor is coupled between the third input and first output; and a fourth is capacitor coupled between the fourth input and third output. The conductor connecting the second input to the second capacitor has substantially equal length to the conductor connecting the third input to the third capacitor. Also, the conductors connecting each capacitor to its respective output all have substantially equal length.

Another embodiment relates to a two-stage, passive, quadrature, RC polyphase filter (PPF) operative at Extremely High Frequencies (EHF), comprising two PPF stages according to the previous embodiment connected in series, wherein each of the first, second, third, and fourth outputs of the first stage is connected to a corresponding input of the second stage.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 12 is a table comparing performance parameters of prior art and inventive polyphase filters.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A polyphase filter consists of a passive RC structure which is commonly used for differential quadrature generation. Such a structure can easily be cascaded to generate a broadband quadrature signal. The structure can also be used as a complex filter, but the focus in this disclosure is on quadrature generation. The operation of a conventional PPF for low-GHz applications is explained in detail in the paper by Behbahani, F. and Kishigami, Y. and Leete, J. and Abidi, A. A., titled, "CMOS mixers and polyphase filters for large image rejection," published in the *IEEE Journal of Solid-State Circuits*, vol. 36, no. 6, pp. 873-887, June 2001, the disclosure of which is incorporated herein by reference in its entirety. Signal loss and influence of parasitics are two important aspects concerning PPFs at mm-wave frequencies. The design concerns at mm-wave frequencies then differ from low-GHz techniques.

Image Rejection Ratio (IRR) is a function of quadrature signal amplitude α and phase mismatch θ and is defined by $$IRR = \frac{1 + 2 \cdot \alpha \cos(\theta) + \alpha^2}{1 - 2 \cdot \alpha \cos(\theta) + \alpha^2} \tag{1}$$

Figure 1A:
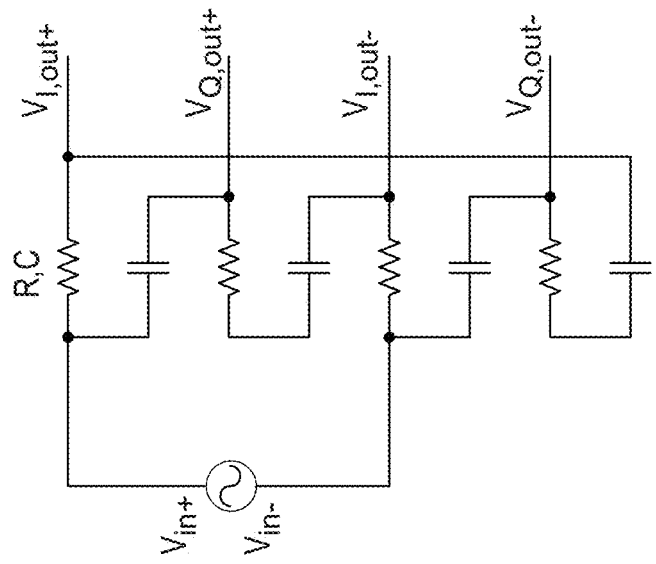
FIGS. 1A and 1B are schematic diagrams of a polyphase filter, having different input feeds.
Figure 1B:
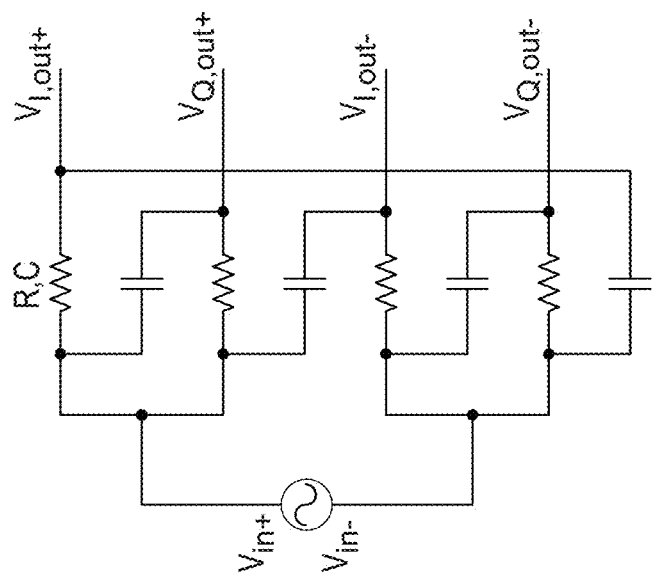

Signal loss in the mm-wave PPF can go relatively high compared with low-GHz applications. It can be relaxed by selecting an optimal input feeding structure and making a compact floorplan to minimize the interconnect length, as discussed in greater detail herein. FIGS. 1A and 1B depict two input feeding structures for quadrature generation. These have an influence on the operation of the PPF. The ratio of transfer function of the differential I and Q of an unloaded filter is given by equations (2) and (3) below for type-a and type-b input feeds, respectively. Type-a has a constant amplitude and type-b has a constant phase behavior. For more information, see the paper by J. Kaukovuori, K. Stadius, J. Ryynanen, and K. Halonen, titled, "Analysis and Design of Passive Polyphase Filters," published in the *IEEE Transactions on Circuits and Systems I: Regular Papers*, vol. 55, no. 10, pp. 3023-3037, November 2008, the disclosure of which is incorporated herein by reference in its entirety.

$$H_{type-a} = \frac{\Delta V_{I,out}}{\Delta V_{Q,out}} = \frac{1 - sRC}{1 + sRC} \tag{2}$$

$$H_{type-b} = \frac{\Delta V_{I,out}}{\Delta V_{Q,out}} = \frac{1}{sRC} \tag{3}$$

Both types of input feed result in the same Image Rejection Ratio (IRR), as it is a function of both amplitude and phase imbalance. Type-b has constant phase difference of 90° and the amplitude imbalance can potentially be corrected by limiting amplifiers to improve the IRR. As amplification is a luxury at mm-wave frequencies, the type-b structure will contribute significantly to the power budget for the LO path. The signal loss of type-a is 3 dB, as compared to 6 dB for type-b per stage for an unloaded filter. Therefore, type-a benefits the power budget, and hence this structure is preferred at mm-wave frequencies. Accordingly, only the type-a input feed is considered herein.

Most of the prior art PPF implementations have been at relatively lower frequency (i.e., below 10 GHz). Physical chip layout affects PPF performance. Some techniques used to improve layout in these prior art designs include the use of dummies, relatively large physical dimensions to improve matching, serpentine interconnects to match lengths, and the like. These techniques are necessary to achieve better than 40 dB of quadrature accuracy at low-GHz frequencies. The same techniques cannot be applied at mm-wave frequencies. For example, serpentine interconnects are lossy at mm-wave frequencies. For details of these prior art designs, see the papers by Behbahani, F. and Kishigami, Y. and Leete, J. and Abidi, A. A., titled, "CMOS mixers and polyphase filters for large image rejection," published in the *IEEE Journal of Solid-State Circuits*, vol. 36, no. 6, pp. 873-887, June 2001; C. Meng, D. Sung, and G. Huang, titled, "A 5.2-GHz GaInP/GaAs HBT double-quadrature downconverter with polyphase filters for 40-dB image rejection," published in the *IEEE Microwave and Wireless Components Letters*, 15, no. 2, pp. 59-61, February 2005; and H. Kodama, H. Ishikawa, N. Oshima, and A. Tanaka, titled, "A 1.3-degree I/Q phase error, 7.1-8.7-ghz LO generator with single-stage digital tuning polyphase filter," published in the in *IEEE Symposium on VLSI Circuits* (VLSIC), June 2010, pp. 145-146; the disclosures of all of which are incorporated herein by reference in their entireties.

Figure 2B:
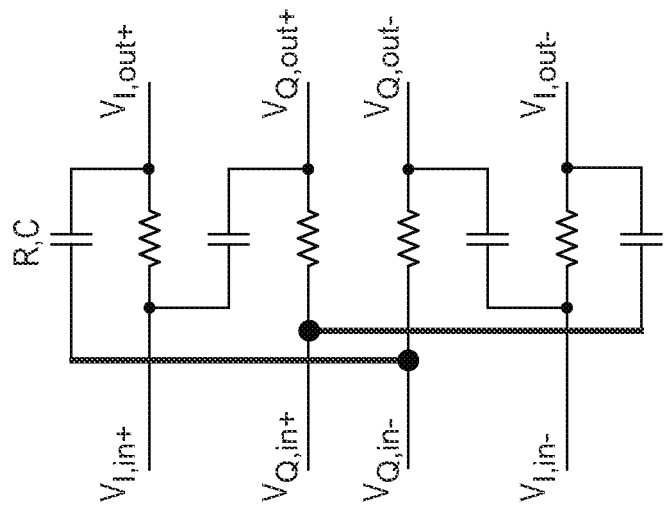
FIG. 2B is a schematic depicting a symmetrical layout of a polyphase filter according to one embodiment of the present invention, wherein within pairs the capacitor input leads have substantially equal length.
Figure 2A:
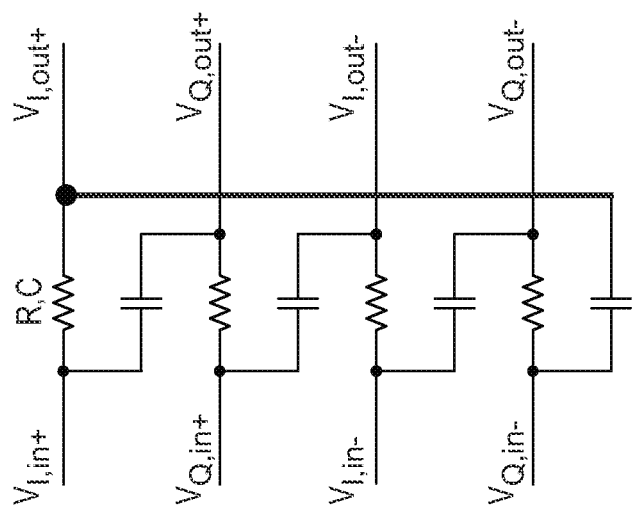
FIG. 2A is a schematic depicting conventional layout of a polyphase filter.

FIG. 2A depicts the asymmetric long interconnect, highlighted as a bold line, typical of prior art PPF designs. At mm-wave frequencies (such as 60 GHz), long interconnects can have significant inductance—approximately 600 fH/μm depending on the thickness and width. In a conventional layout, denoted as form-I in FIG. 2A, the length of the long interconnect is 40 μm. The desired pole is shifted due to the dominant inductive interconnect along with other parasitic capacitances.

To reduce this effect, according to embodiments of the present invention, the layout of the filter is changed, as depicted in FIG. 2B. Although logically and electrically identical, the layout of FIG. 2B interchanges the lower two signal paths, placing the differential Q signal inputs on adjacent paths, with the I inputs distributed at the top and bottom. This layout also changes the lengths of interconnect to the capacitors. In particular, the differential Q signal inputs have longer, but equal length, interconnect to their respective capacitors. Also, the interconnect between each capacitor and its respective output is of equal length. Indeed, since the capacitor and resistor connections to each output are adjacent, each output may be connected to the (center of) the node joining the respective resistors and capacitors. In this layout, the overall interconnect length is reduced by 40% and the structure is more symmetrical. As such, this structure is more robust than form-I against capacitive parasitics, as will be explained in greater detail herein. The layout depicted in FIG. 2B is referred to herein as form-II. Note that the PPF circuit is still cascadable for broadband operation.

The filter of FIG. 2B is depicted with a particular ordering of differential I and Q inputs (different from the form-I stage of FIG. 2A, as described above). Those of skill in the art will appreciate that there are four valid orderings, or connections, of inputs to the form-II layout of FIG. 2B, which may be derived by circular right-shift. In particular, the first through fourth inputs of the filter may be connected, respectively as $V_{I+}$ $V_{Q+}$ $V_{Q-}$ $V_{I-}$ (the configuration depicted in FIG. 2B); $V_{I-}$ $V_{I+}$ $V_{Q+}$ $V_{Q-}$; $V_{Q-}$ $V_{I-}$ $V_{I+}$ $V_{Q+}$; or $V_{Q+}$ $V_{Q-}$ $V_{I-}$ $V_{I+}$.

Figure 3B:
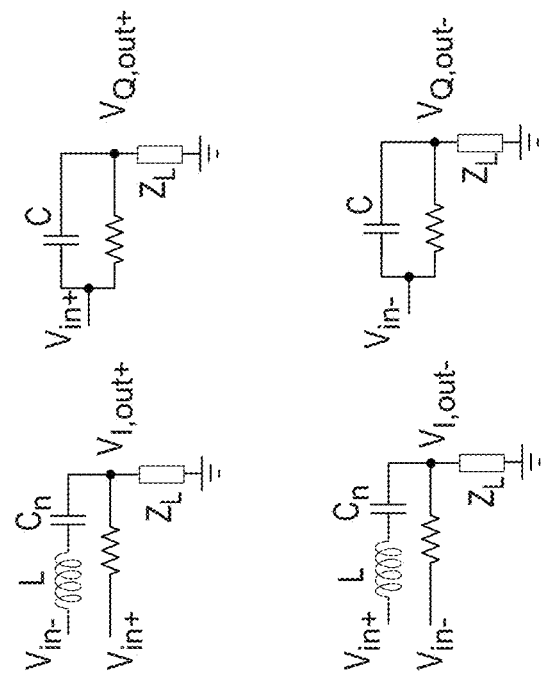
FIG. 3B depicts schematics of equivalent circuits for the output of the polyphase filter of FIG. 3A.
Figure 3A:
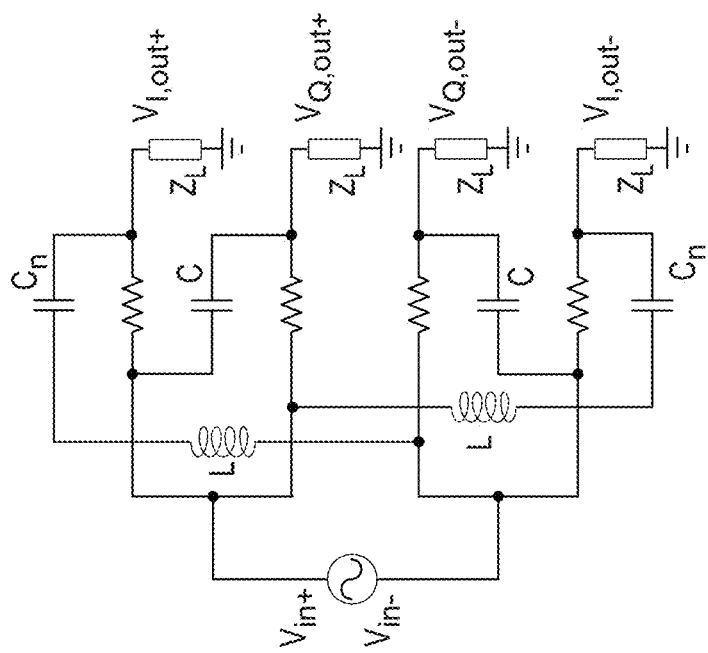
FIG. 3A is a schematic representation of an L-compensated polyphase filter depicting parasitic inductances.
Figure 4:
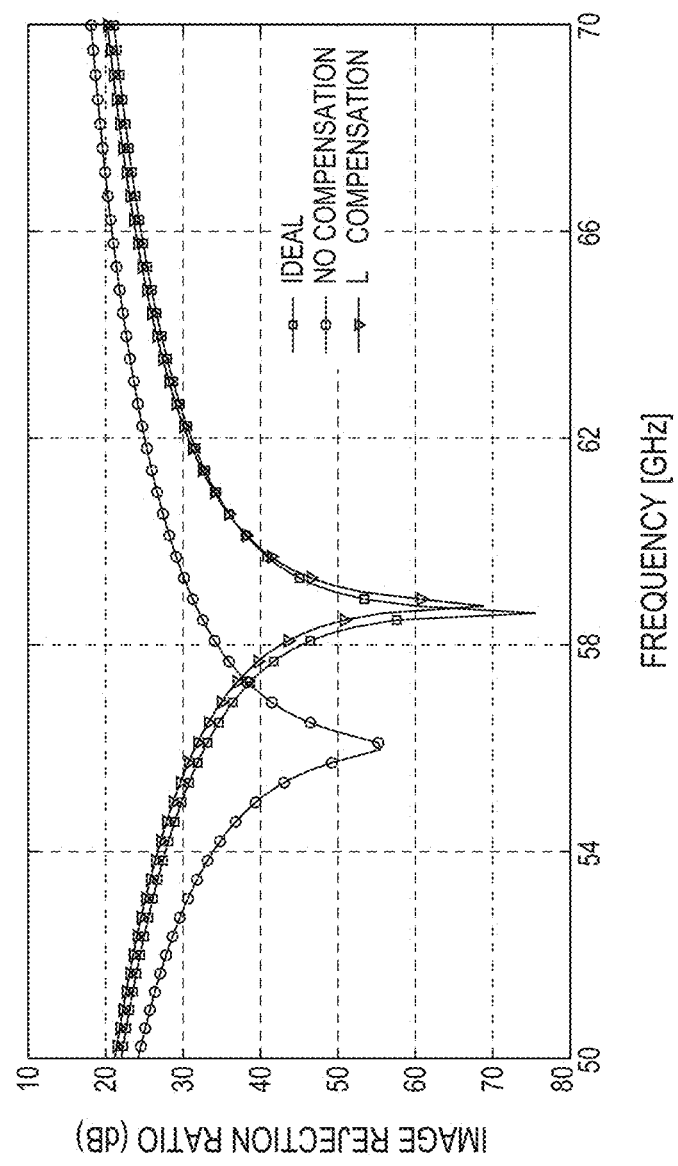
FIG. 4 is a graph depicting image rejection ratio performance of the L-compensated polyphase filter.

FIG. 3A depicts a one-stage, form-II polyphase filter with type-a input feed according to one embodiment of the present invention. Due to the inductive parasitic effect, the susceptance of the outer branch deviates from the ideal and the pole frequency moves off, as shown in the graph of FIG. 4. To compensate for this, the effective susceptance is made equal to the susceptance of the unaffected capacitor at the pole frequency by reducing the outer C to a new value $C_n$ given by equation (4). This technique is referred to herein as L-compensation.

$$\frac{1}{sC} = \frac{1}{sC_n} + sL \tag{4}$$

Figure 5:
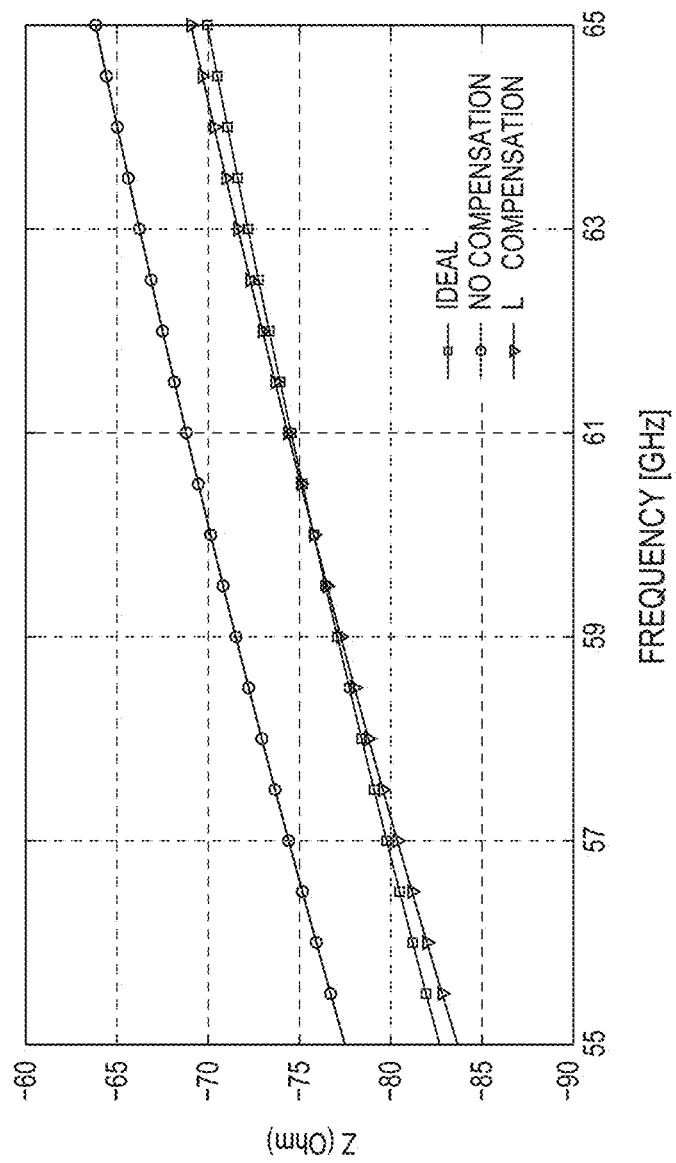
FIG. 5 is a graph depicting impedance variation for L-compensated and uncompensated polyphase filters.

By this compensation, the susceptance in each of the four branches is equal at the pole frequency. The variation from the ideal case after correction is reduced drastically, as shown in the graph of FIG. 5. The variation at either side of pole frequency has negligible influence on one-stage, form-II PPF, but has some effect on two-stage as explained in greater detail herein. Generally, a buffer follows a PPF and the load impedance seen by a one-stage filter can be considered to be equal for all the outputs.

FIG. 3B depicts the simplified circuit for nodal analysis of each of the outputs. Using this, the differential I and Q transfer function for a one-stage, L-compensated PPF is derived as given by equations (5) and (6) below. The ratio of I and Q approaches that of equation (1). The benefit of L-compensation of equation (4) is shown in the graph of FIG. 4 and it matches very closely to the ideal case.

$$\Delta V_{I,out} = \frac{[1 - sC_n R + s^2 LC_n]Z_L \Delta V_{in}}{[R + Z_L + sC_n R Z_L + s^2 LC_n(R + Z_L)]} \quad (5)$$

$$\Delta V_{Q,out} = \frac{[1 + sCR]Z_L \Delta V_{in}}{[R + Z_L + sCR Z_L]} \quad (6)$$

Figures 8A, 8B:
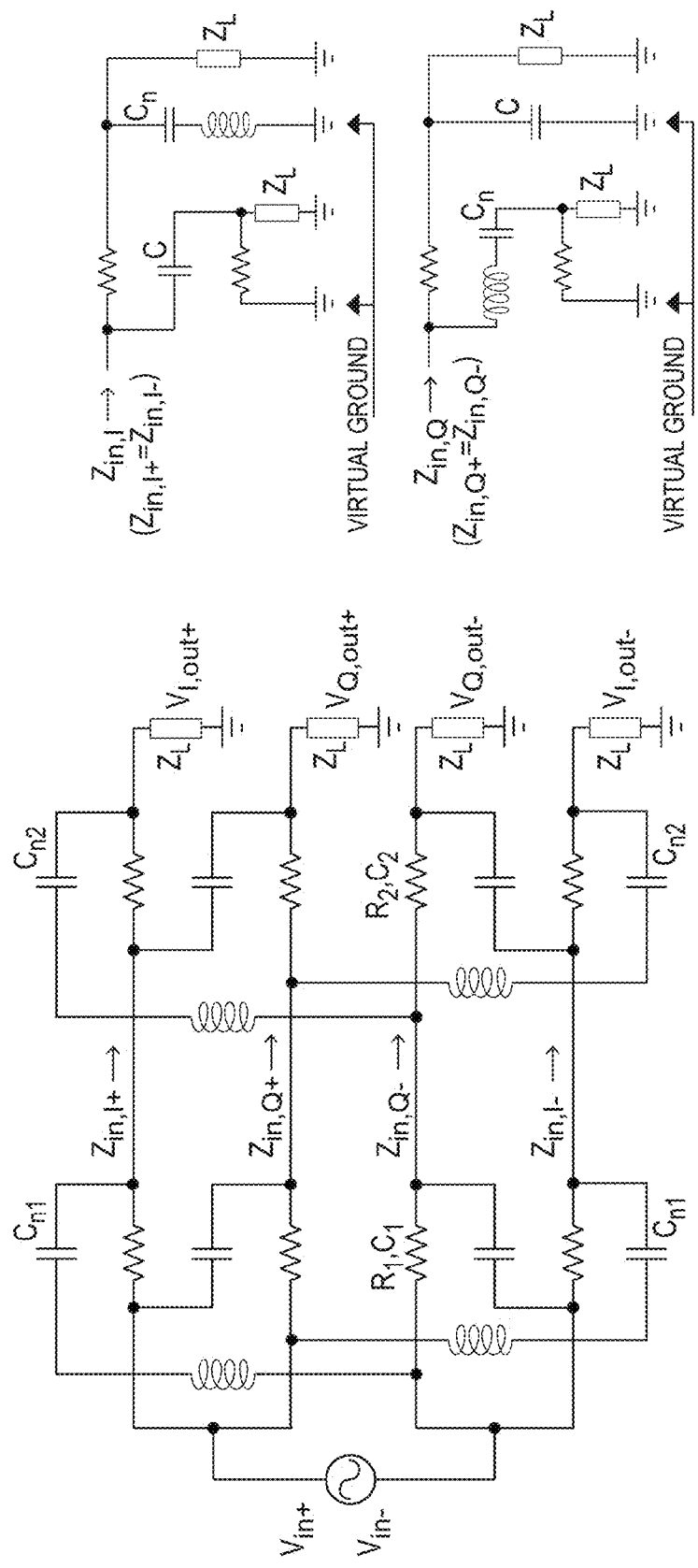
FIG. 8A is a schematic representation of an L-compensated, two-stage polyphase filter depicting parasitic inductances.
FIG. 8B depicts schematics of equivalent circuits for the output of the two-stage polyphase filter of FIG. 8A.

A two-stage filter is generally necessary to achieve broadband quadrature LO. A two-stage, type-a PPF is analyzed as shown in FIG. 8A. The first stage (R1, C1) is similar to the filter analyzed above except that it is loaded with another stage, of a form-II filter.

Ideally the input impedance offered by a filter is the same in all the four paths, as there exists a virtual ground at the Q input when a balanced input signal is applied to the I input, and vice versa. See Kaukovuori, et al. At mm-wave frequencies, this condition accurately exists only at the pole frequency when an L-compensated PPF is considered. At neighboring frequencies, it can still be treated as a virtual ground for the analysis, and the error introduced is negligible. As the structure in FIG. 8A is symmetrical, the input impedance $Z_{in,I+}$ and $Z_{in,I-}$ are equal and denoted by $Z_{in,I}$. Similar argument applies for Q. The load impedances for the first stage are represented by an equivalent circuit by using the concept of virtual ground, as shown in FIG. 8B. Using this, the impedances $Z_{in,I}$ and $Z_{in,Q}$ are given by equations (7) and (8). It can be verified that if L=0 and $C_n$=C then $Z_{in,I}$=$Z_{in,Q}$.

$$Z_{in,I} = \frac{[R + Z_L + sC_n R Z_L + s^2 LC_n(R + Z_L)] \cdot [R + Z_L + sCR Z_L]}{[R + Z_L + sC_n R Z_L + s^2 LC_n(R + Z_L) \cdot sC(R + Z_L) + (R + Z_L + sCR Z_L)(1 + sC_n Z_L + s^2 LC_n)]} \quad (7)$$

$$Z_{in,Q} = \frac{[R + Z_L + sC_n R Z_L + s^2 LC_n(R + Z_L)] \cdot [R + Z_L + sCR Z_L]}{[R + Z_L + sC_n R Z_L + s^2 LC_n(R + Z_L)] \cdot (1 + sCZ_L) + (R + Z_L + sCR Z_L)sC(R + Z_L)} \quad (8)$$

Figure 6:
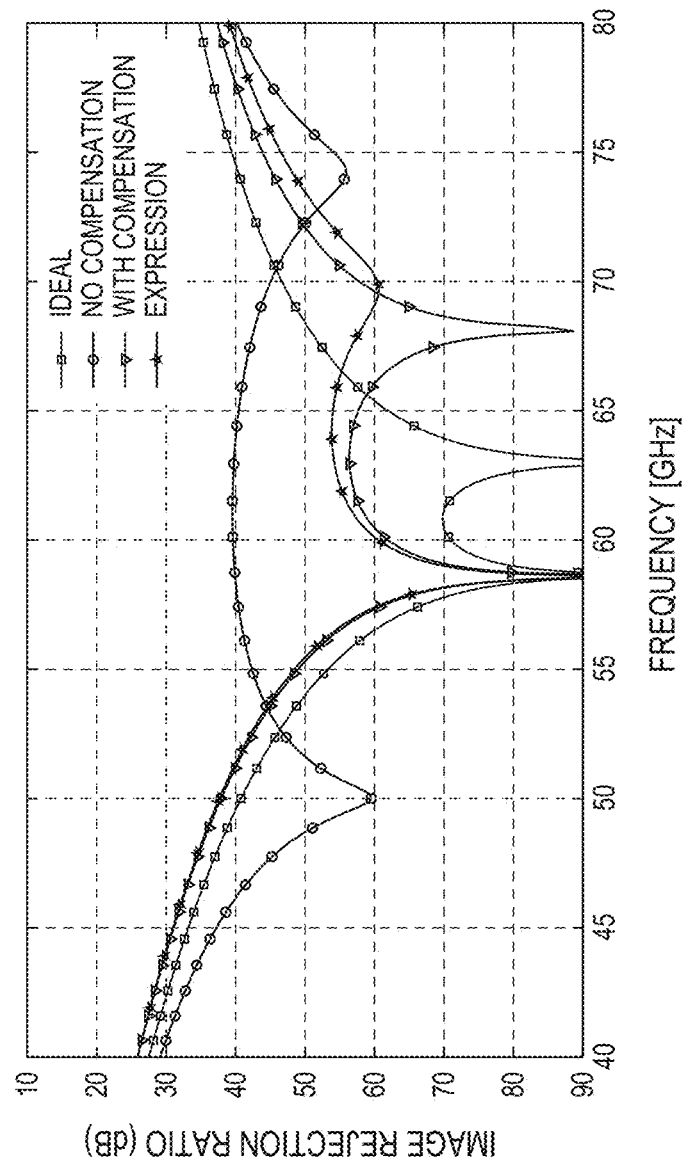
FIG. 6 is a graph depicting image rejection ratio performance of a two-stage, L-compensated polyphase filter.

These impedances act as the load to the first stage of a two-stage PPF. The transfer function of a two-stage filter can be evaluated by following the procedure above. $\Delta V_{I,out}$ of equation (5) then becomes a function of $Z_{in,I}$ instead of $Z_L$. And similarly $\Delta V_{Q,out}$ of equation (6) becomes a function of $Z_{in,Q}$. Hence the IRR becomes a function of the load impedance, which is not the case at low frequencies. FIG. 6 compares the image rejection achieved by the two-stage, L-compensated method with no compensation, to highlight the benefit. The lower frequency pole is due to the second stage and the higher frequency pole is due to the first stage. The IRR degrades for the pole corresponding to the first stage because of non-constant load. The second stage pole is not influenced much, and stays at the designed frequency. Hence there is a small bulge at the first stage pole. There is an improvement of 15 dB when the compensation is used in comparison to the unused case, and matches well with the presented analysis. The amplitude and phase mismatch are below 0.001 dB and 0.2° over the 10 GHz bandwidth (IRR>55 dB). The analysis can be similarly applied for three- and higher stages, but the loss increases correspondingly.

Figure 7B:
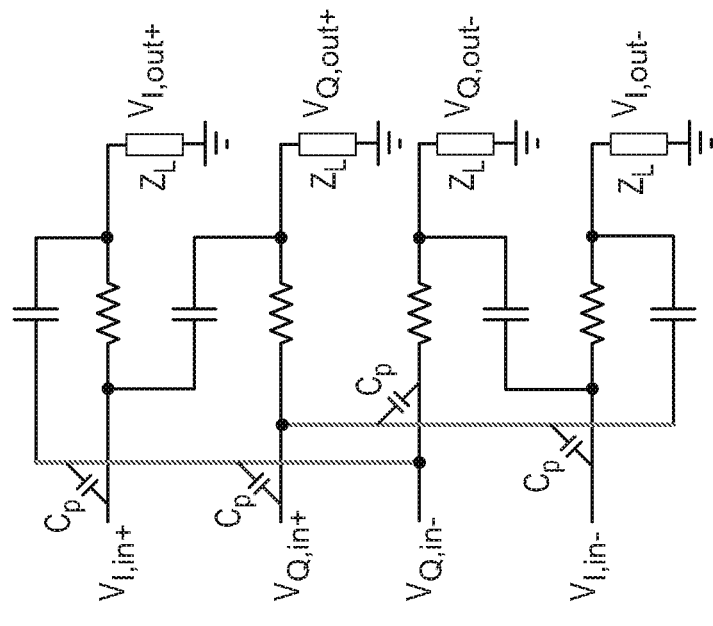
FIGS. 7A and 7B are schematics depicting parasitic capacitances for conventional and inventive layouts, respectively, of a polyphase filter.
Figure 7A:
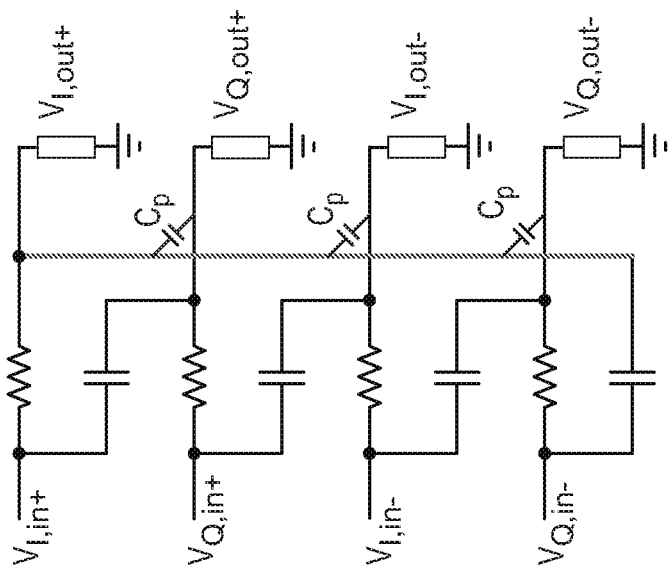

A simple overlap of two metal layers has an overlap parasitic capacitance associated with that crossing. At mm-wave frequencies, the effect of all the overlap parasitics has a considerable impact on the performance of the filter. The overlap parasitic capacitances are unavoidable in both the form-I and form-II implementations. However, their positions are different in each case, as shown in FIGS. 7A and 7B. For form-I they occur unevenly due to the inherent asymmetry. Because of this, the amplitudes of $\Delta V_{I,out}$ and $\Delta V_{Q,out}$ are different from the ideal due to the interaction of signals via the parasitic capacitive path. For form-II, they occur more symmetrically and hence their impact is reduced.

Figure 9:
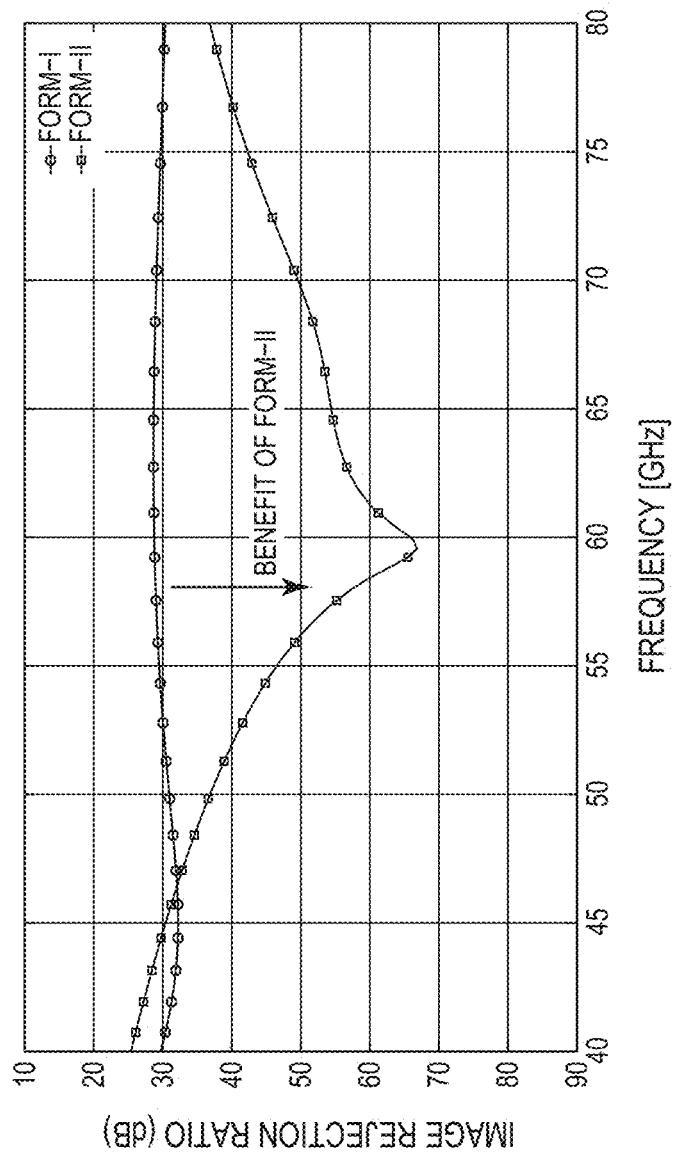
FIG. 9 is a graph depicting image rejection ratio performance of the two-stage polyphase filters of FIGS. 2A and 2B.

It is worth mentioning that the dominant inductive parasitics arising due to the long interconnects, as discussed previously, can also be compensated for form-I. But as its length is longer than in form-II, the required compensation is much greater than in case of form-II. The compensation necessary for form-I is more than 20% of the total capacitance, as compared to 10% for form-II. See the paper by D. Zhao, S. Kulkarni, and P. Reynaert, titled, "A 60 GHz Outphasing Transmitter in 40 nm CMOS with 15.6 dBm Output Power," published in the in *IEEE International Solid-State Circuits Conference Digest of Technical Papers* (ISSCC), February 2012, pp. 170-171, the disclosure of which is incorporated herein by reference in its entirety. This leads to routing difficulties in form-I. EM field simulations of the complete interconnect structure of both the forms was performed by ADS momentum, which enables to model them by S-parameters. FIG. 9 depicts the simulation results, including the effect of all parasitics along with compensation schemes. This shows that even after compensation for form-I, it cannot achieve image rejection better than 30 dB. The robustness of form-II verses form-I against parasitics is thus evident.

A two-stage, polyphase filter was used to generate mm-wave quadrature signals for a 60 GHz outphasing transmitter (TX) in 40 nm CMOS technology. A chip photograph of the layout of the TX is depicted in the Zhao, et al. paper. In this design, optimization yields $R_1$=75Ω, $C_1$=33.5 fF and $C_{n1}$=30 fF in the first stage, and $R_2$=75Ω, $C_2$=36.5 fF, and $C_{n1}$=33 fF in the second stage. $C_{n1}$ and $C_{n2}$ are reduced by 3.5 fF to compensate.

Figure 11:
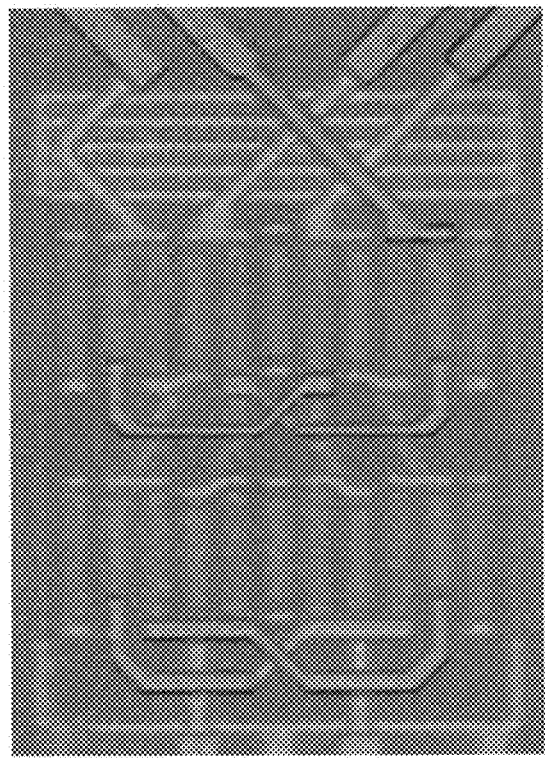
FIG. 11 is a micro photograph of a two-stage polyphase filter according to embodiments of the present invention.

Salicided p+ resistors and interdigitated metal-oxide-metal (MOM) capacitors were used in the PPF. The sizes of the salicided resistors were optimized to reduce the impact of mismatch and the associated parasitic capacitance. There is a trade off between matching and resistor cutoff frequency, as described by Behbahani, et al. The sizes of the capacitors were also chosen to match the aspect ratio of resistors, to minimize the routing overhead. Dummy capacitors were used in between two continuous resistors, and dummy resistors were used next to outer capacitors to provide same neighboring environment and mitigate lithography edge effects. The parasitic inductances were calculated by the Sparameter model of the interconnect, which is used to compute the compensation value $C_n$. An accurate value of $C_n$ was found, as a MOM capacitor value can be controlled accurately depending on its dimensions. The layout was designed in a compact manner to reduce the 60 GHz interconnect length and hence minimize the signal loss. The active area of the PPF was only 65 μm×50 μm. FIG. 11 is a chip photograph. In the simulations, both extracted RC parasitics and S-parameter model of the interconnect are included. Simulated voltage loss is 6.5 dB for a tuned load of 850Ω and 5.3 dB when computed by analytical expression. The 1.2 dB difference is due to the unaccounted loss of interconnects.

Figure 10:
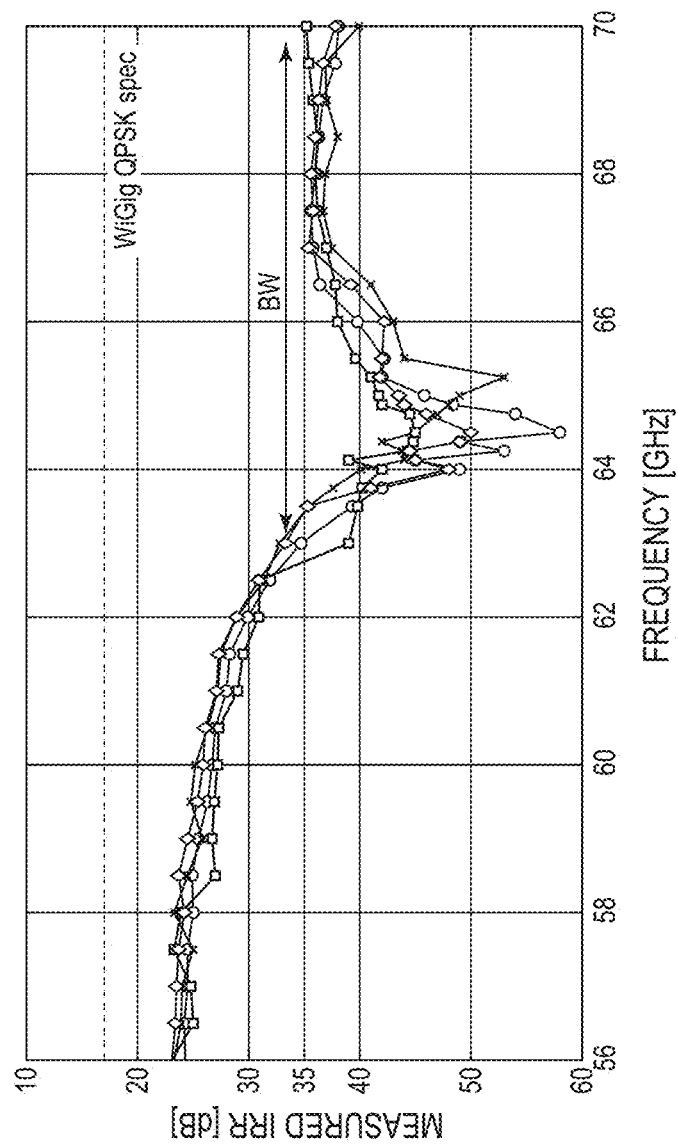
FIG. 10 is a graph of the measured image rejection ratio of the two-stage polyphase filter of FIG. 8A.

Input single tone baseband signals were upconverted by onchip mixers using the quadrature LO signal generated by the inventive PPF. The IRR was measured by measuring the frequency spectrum using a Spectrum Analyzer. The measured I/Q imbalance from the transmitter was a combined effect of all the inaccuracies including the PPF, mismatch in the signal path, and measurement setup. Therefore the actual PPF performance is equal to or better than the measured IRR. Four samples were measured and the results are shown in FIG. 10 with a minimum of −58 dB. The IRR spread is less than 5 dB and less than 1 GHz, which confirms good matching and validates the compensation technique. Using this PPF, the 60-GHz Outphasing Transmitter implemented in 40-nm CMOS, described in Zhao, et al., achieved an EVM of −35 dB for a QPSK/8PSK signal. This confirms the excellent IRR achieved by this embodiment of the present invention. The table of FIG. 12 presents a performance comparison with prior art implementations of mm-wave PPFs. The inventive PPF achieves the highest reported image rejection at mm-wave frequencies by using the optimal symmetrical layout and parasitic-aware design technique.

The prior-art mm-wave PPFs referenced in FIG. 12 are listed below. These papers are incorporated herein by reference in their entireties.

[1] A. Parsa and B. Razavi, "A new transceiver architecture for the 60-ghz band," *IEEE Journal of Solid-State Circuits*, vol. 44, no. 3, pp. 751-762, March 2009.

[2] W. Chan and J. Long, "A 60-ghz band 2×2 phased-array transmitter in 65-nm CMOS," *IEEE Journal of Solid-State Circuits*, vol. 45, no. 12, pp. 2682-2695, December 2010.

[3] Notten, M. G. M. and Veenstra, H., "60 GHz quadrature signal generation with a single phase VCO and polyphase filter in a 0.25 um SiGe BiCMOS technology," in *IEEE Bipolar/BiCMOS Circuits and Technology Meeting*, 2008, pp. 178-181.

[4] H. Forstner, M. Ortner, and L. Verweyen, "A fully integrated homodyne upconverter MMIC in SiGe:C for 60 GHz wireless applications," in *IEEE 11th Topical Meeting on Silicon Monolithic Integrated Circuits in RF Systems (SiRF)*, January 2011, pp. 129-132.

The two-stage, passive RC polyphase filter for 60 GHz quadrature signal generation, according to one embodiment of the present invention, presents numerous advantages over the prior art. The PPF features an input-feed type with lower loss, which is important for mm-wave frequencies. The dominant inductive parasitic was identified and compensated. An optimal layout reduces the impact of parasitic capacitances, which become important at mm-wave frequencies. The layout achieves an improvement of 15 dB in I/Q accuracy over prior art layouts. The measured performance is better than 35 dB across a bandwidth of more than 6 GHz.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A passive, quadrature, RC polyphase filter (PPF) stage operative at Extremely High Frequencies (EHF), comprising:
  first, second, third, and fourth inputs, numbered contiguously;
  first, second, third, and fourth outputs corresponding to the first, second, third, and fourth inputs, respectfully, also numbered contiguously;
  a resistor interposed between each respective input and output;
  a first capacitor coupled directly between the first input and second output;
  a second capacitor coupled directly between the second input and fourth output;
  a third capacitor coupled directly between the third input and first output;
  a fourth capacitor coupled directly between the fourth input and third output;
  wherein a conductor connecting the second input to the second capacitor has a substantially equal length to another conductor connecting the third input to the third capacitor; and
  wherein respective conductors connecting the first, second, third, and fourth capacitors to the respective output thereof all have a substantially equal length.

2. The PFF stage of claim 1, wherein
  a positive In-phase signal is connected to the first input;
  a positive Quadrature signal is connected to the second input;
  a negative Quadrature signal is connected to the third input; and
  a negative In-phase signal is connected to the fourth input.

3. The PFF stage of claim 1, wherein
  a negative In-phase signal is connected to the first input;
  a positive In-phase signal is connected to the second input;
  a positive Quadrature signal is connected to the third input; and
  a negative Quadrature signal is connected to the fourth input.

4. The PFF stage of claim 1, wherein
  a negative Quadrature signal is connected to the first input;
  a negative In-phase signal is connected to the second input;
  a positive In-phase signal is connected to the third input; and
  a positive Quadrature signal is connected to the fourth input.

5. The PFF stage of claim 1, wherein
  a positive Quadrature signal is connected to the first input;
  a negative Quadrature signal is connected to the second input;
  a negative In-phase signal is connected to the third input;
  a positive In-phase signal is connected to the fourth input.

6. The PPF stage of claim 1, further comprising a constant amplitude input feed connected to the first, second, third, and fourth inputs.

7. The PFF stage of claim 1, further comprising a constant phase input feed connected to the first, second, third, and fourth inputs.

8. The PPF stage of claim 1, wherein the second and third capacitors connected to the second and third inputs have a capacitance $C_n$, and the first and fourth capacitors connected to the first and fourth inputs have a capacitance C, and wherein the PPF stage is compensated for an inductive parasitic effect by the capacitances $C_n$ having a value related to the capacitances C given by $$\frac{1}{sC} = \frac{1}{sC_n} + sL$$

where L is a parasitic inductance of the respective conductors connecting the $C_n$ capacitances to the second and third inputs, and where s is a complex angular frequency.

9. The PPF stage of claim 1 wherein each of the resistors comprises a salicided p+ resistor.

10. The PPF stage of claim 1 wherein the first, second, third, and fourth capacitors comprise metal-oxide-metal capacitors.

11. A two-stage, passive, quadrature, RC polyphase filter (PPF) operative at Extremely High Frequencies (EHF), comprising first and second PPF stages according to claim 1 connected in series, wherein each of the first, second, third, and fourth outputs of the first stage are connected to the corresponding first, second, third, and fourth inputs of the second stage.

12. The two-stage PPF of claim 11, further comprising a constant amplitude input feed connected to the first, second, third, and fourth inputs.

13. The two-stage PPF of claim 11, further comprising a constant phase input feed connected to the first, second, third, and fourth inputs.

14. The two-stage PPF of claim 11, wherein the second and third capacitors connected to the second and third inputs have a capacitance $C_n$, and the first and fourth capacitors connected to the first and fourth inputs have a capacitance C, and wherein the two-stage PPF is compensated for an inductive parasitic effect by the capacitances $C_n$ having a value related to the capacitances C given by $$\frac{1}{sC} = \frac{1}{sC_n} + sL$$

where L is a parasitic inductance of metallization conductors connecting the $C_n$ capacitances to the second and third inputs of each stage, and where s is a complex angular frequency.

15. The two-stage PPF of claim 11 wherein the two-stage PPF is operative to generate mm-wave quadrature signals for a 60 GHz outphasing transmitter.

16. A passive, quadrature, RC polyphase filter (PPF) stage operative at Extremely High Frequencies (EHF), comprising:
first, second, third, and fourth inputs arranged along one side of the PPF stage;
corresponding first, second, third, and fourth outputs arranged along the opposite side of the PPF stage from the first, second, third, and fourth inputs;
a resistor interposed between each respective input and output;
a first capacitor coupled directly between the first input and second output;
a second capacitor coupled directly between the second input and fourth output;
a third capacitor coupled directly between the third input and first output;
a fourth capacitor coupled directly between the fourth input and third output;
wherein a conductor connecting the second input to the second capacitor has a substantially equal length to another conductor connecting the third input to the third capacitor; and
wherein respective conductors connecting the first, second, third, and fourth capacitors to the respective output thereof all have a substantially equal length.

\* \* \* \* \*